United States Patent
Thomas et al.

(10) Patent No.: US 7,130,196 B2
(45) Date of Patent: Oct. 31, 2006

(54) APPARATUS AND METHOD FOR TRANSFERRING HEAT FROM CONTROL DEVICES

(75) Inventors: Sherman Glenn Thomas, Charlottesville, VA (US); Owen Newton Wells, Ruckersville, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/905,749

(22) Filed: Jan. 19, 2005

(65) Prior Publication Data

US 2006/0158852 A1 Jul. 20, 2006

(51) Int. Cl.
*H05K 7/20* (2006.01)

(52) U.S. Cl. ............... 361/719; 361/687; 361/704; 361/714; 164/80.2

(58) Field of Classification Search ........... 361/687, 361/704, 715–719; 174/16.1; 165/80.3, 165/185
See application file for complete search history.

(56) References Cited

U.S. PATENT DOCUMENTS

| | | | | |
|---|---|---|---|---|
| 5,814,909 A | * | 9/1998 | Yamada et al. ............ 310/64 |
| 5,887,435 A | * | 3/1999 | Morton .................... 62/3.6 |
| 5,898,572 A | * | 4/1999 | Shennib et al. ........... 361/713 |
| 6,026,565 A | * | 2/2000 | Giannatto et al. .......... 29/830 |
| 6,049,469 A | * | 4/2000 | Hood et al. ............... 361/818 |
| 6,101,090 A | * | 8/2000 | Gates .................... 361/690 |
| 6,301,115 B1 | * | 10/2001 | Hashimoto et al. ........ 361/704 |
| 6,430,052 B1 | * | 8/2002 | Kordes et al. ............ 361/719 |
| 6,501,662 B1 | * | 12/2002 | Ikeda ..................... 361/760 |
| 6,648,399 B1 | * | 11/2003 | Ozawa et al. ............. 296/208 |
| 6,731,001 B1 | * | 5/2004 | Kinouchi et al. .......... 257/734 |
| 6,856,511 B1 | * | 2/2005 | Viernes et al. ............ 361/704 |
| 6,972,581 B1 | * | 12/2005 | Yamashita et al. .......... 324/760 |

* cited by examiner

*Primary Examiner*—Boris Chervinsky
(74) *Attorney, Agent, or Firm*—Cantor Colburn LLP

(57) ABSTRACT

A control device configured for mounting within an enclosure having a thermally conductive surface is disclosed. The control device includes a housing, a heat-generating device disposed within the housing, and a thermal conductor. The thermal conductor has a first portion in thermal communication with the heat-generating device and a second portion configured to be in thermal communication with the thermally conductive surface of the enclosure.

16 Claims, 3 Drawing Sheets

APPARATUS AND METHOD FOR TRANSFERRING HEAT FROM CONTROL DEVICES

BACKGROUND OF THE INVENTION

The present invention relates generally to control electronic devices, and more particularly to intelligent industrial control devices such as Programmable Logic Controllers (PLCs).

PLCs generally consist of a system power supply, Input/Output (I/O) interfaces, and an intelligent control section that may or may not contain a microprocessor. Some PLCs may be modular in design, such that the control, power supply, and I/O sections, and sometimes the interconnect between these sections, are all separate physical modules that may be interchanged. Some PLCs include electromechanical cooling devices, such as fans or liquid cooling systems for example, to transfer heat away from the heat-generating electronic components enclosed therein. However, some customers that purchase PLCs may prefer not to have such electromechanical cooling devices in their PLC systems for various reasons. These reasons may include, but are not limited to, concerns about the reliability of the cooling device, required regularly scheduled maintenance to clean or replace filters of the cooling device, required regularly scheduled maintenance to lubricate various mechanical components of the cooling device, and concerns relating to excessive heat generation in the event of a malfunctioning cooling device. Electronic components, including those found in PLC systems, generate heat and have manufacturer-dictated ratings on how hot the components may become. The need to remove heat from the PLC and the customer requirement of not using an electromechanical cooling device places limitations on how much heat the PLC components may generate, how high the ambient temperature is allowed to be in the PLC's operating environment, how physically small the PLC modules may be, and thus how much performance and what available features the PLC is capable of delivering.

Accordingly, there is a need in the art for electronic control devices, and particularly PLCs, having a heat transfer arrangement that overcomes these drawbacks.

BRIEF DESCRIPTION OF THE INVENTION

Embodiments of the invention include a control device configured for mounting within an enclosure that has a thermally conductive surface. The control device includes a housing, a heat-generating device disposed within the housing, and a thermal conductor. The thermal conductor has a first portion in thermal communication with the heat-generating device and a second portion configured to be in thermal communication with the thermally conductive surface of the enclosure.

Other embodiments of the invention include a control apparatus having an enclosure with a thermally conductive surface, and a control device disposed within the enclosure and in thermal communication with the thermally conductive surface of the enclosure. The control device includes a housing, a heat-generating device disposed within the housing, and a thermal conductor. The thermal conductor has a first portion in thermal communication with the heat-generating device and a second portion in thermal communication with the thermally conductive surface of the enclosure.

Further embodiments of the invention include a method of transferring heat from within a control apparatus to ambient, the control apparatus having an enclosure with a thermally conductive surface and a control device disposed therein, the control device having a housing with a heat-generating electronic component disposed therein and a thermal conductor with a first portion in thermal communication with the heat-generating electronic component and a second portion in direct thermal communication with the thermally conductive surface. The method includes transferring heat from the heat generating electronic component to the first portion of the thermal conductor, transferring heat from the first portion of the thermal conductor to the second portion of the thermal conductor along a thermal path that excludes the housing of the control device, transferring heat from the second portion of the thermal conductor to the thermally conductive surface of the enclosure of the control apparatus, and transferring heat from the thermally conductive surface to ambient.

BRIEF DESCRIPTION OF THE DRAWINGS

Referring to the exemplary drawings wherein like elements are numbered alike in the accompanying Figures.

DETAILED DESCRIPTION OF THE INVENTION

An embodiment of the invention provides an electronic control apparatus having a plurality of electronic control devices disposed therein and a thermal conductor for transferring heat from a heat-generating device disposed within one of the control devices to an exterior surface of the control apparatus. In an embodiment, the plurality of electronic control devices are a plurality of modular PLCs. The thermal conductor within a PLC has one end thermally connected to a heat-generating electronic component of the PLC, and another end thermally connected, via an opening in the housing of the PLC, to a thermally conductive outer surface of the enclosure of the control apparatus that houses the PLC. In this manner, heat generated at the electronic component may be transferred out of the PLC to the enclosure outer surface of the control apparatus for subsequent dissipation to the ambient in which the control apparatus is situated. While embodiments of the invention may be described herein as pertaining to electronic devices, and to PLCs in particular, it will be appreciated that the disclosed invention is not so limited and may be applicable to other heat generating apparatus, such as motors, transformers, or bearings, for example.

Figure 1:
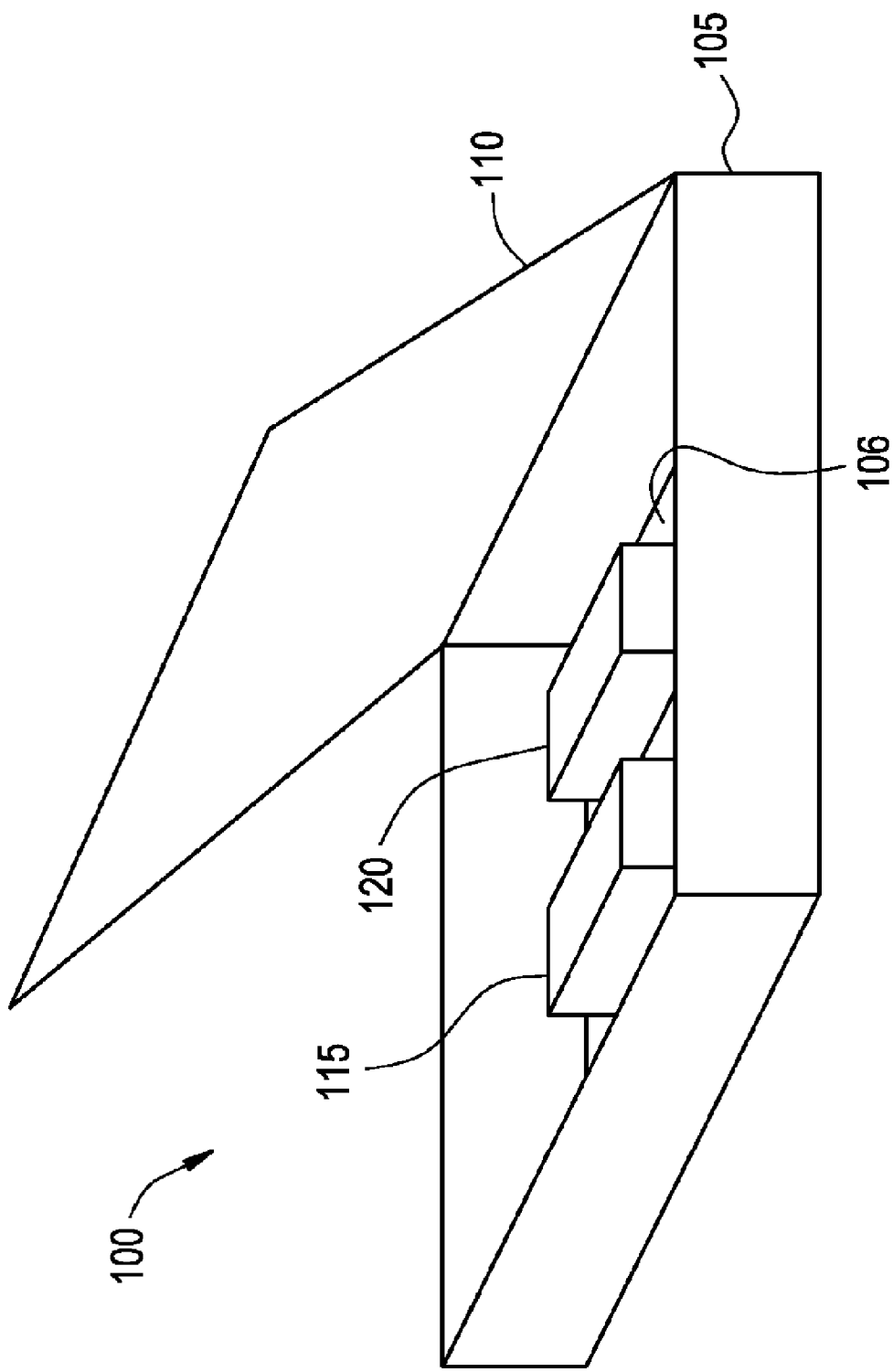
FIG. 1 depicts an isometric view of an exemplary embodiment of a control apparatus for use in accordance with an embodiment of the invention.

FIG. 1 is an isometric view of an exemplary embodiment of an industrial control apparatus 100 having an enclosure 105 with a door 110 (depicted open) and a plurality of control devices 115, 120, such as PLCs for example, disposed therein. Control devices 115, 120 are mounted to a back surface 106 of enclosure 105 by any means suitable for the purpose. As will be discussed in more detail below, surface 106 is a thermally conductive surface. Enclosure 105 with door 110 is herein described and illustrated as a box, which in an embodiment is of a metal construction. However, it will be appreciated that the scope of the invention is not so limited, and that the invention may also be applicable to mounting surface 106 being of any material, such as ceramic or composite for example, that either has an exposed surface area or is mounted to another structure that has an exposed surface area that is capable of transferring heat to a surrounding air or liquid.

Figure 2:
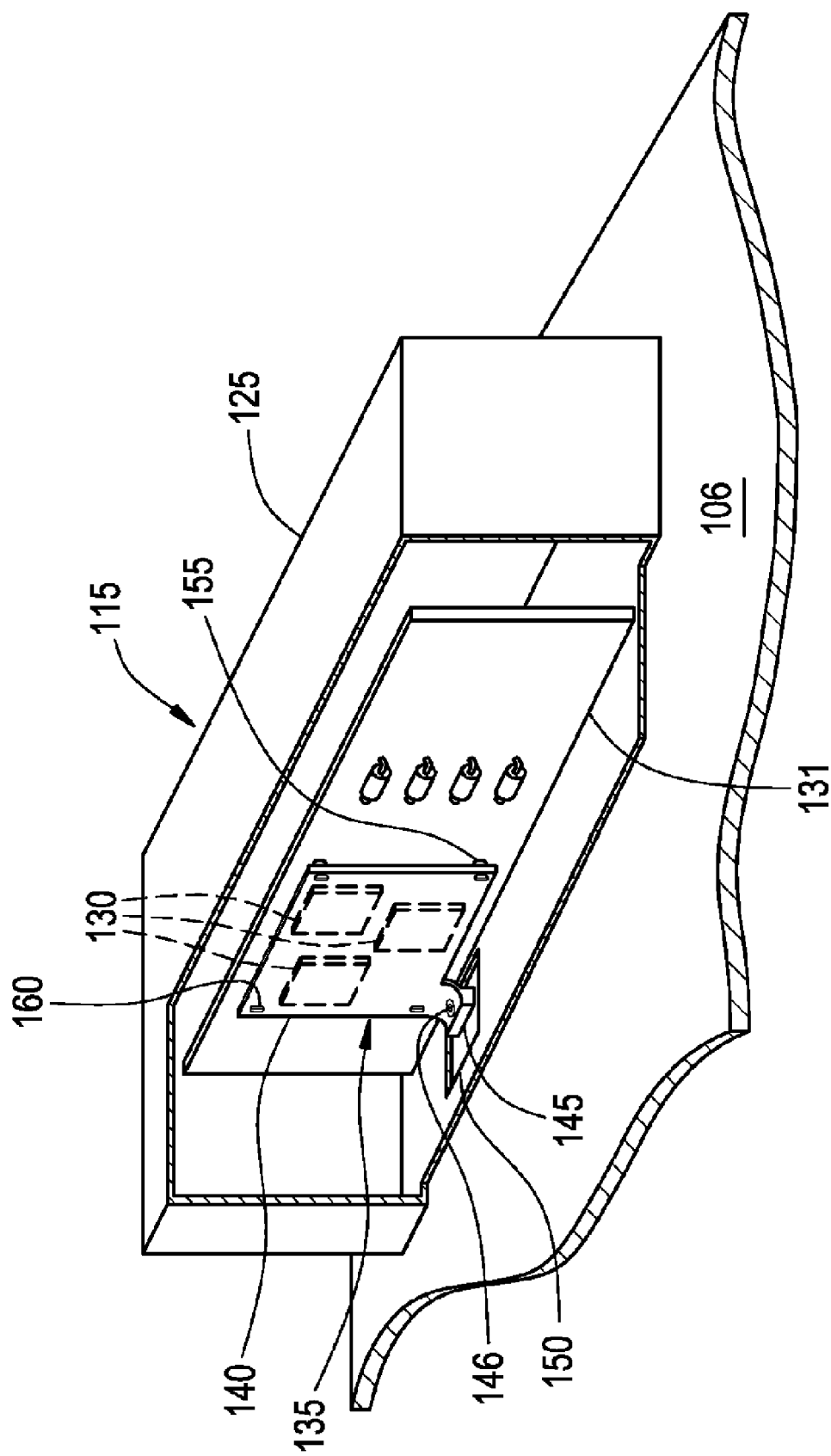
FIG. 2 depicts an isometric partial cutaway view of an exemplary control device for use in the control apparatus of FIG. 1 in accordance with an embodiment of the invention.

Referring now to FIG. 2, an exemplary control device 115 is depicted having a housing 125 mounted to surface 106 of enclosure 105. An exemplary control device 115, such as an industrial controller or PLC for example, includes a heat-generating device 130, such as an electronic component or a processor for example, that generates heat under normal operation and has a manufacturer-dictated operating temperature rating. Heat generating device 130 may be one of many electronic devices that are mounted to a circuit board 131. A thermal conductor 135 has a first portion 140 that is in thermal communication with a heat-generating device 130, and a second portion 145 that extends into the opening 150 of housing 125. Second portion 145 is thermally bonded to, or more generally is in thermal communication with, the thermally conductive surface 106 of enclosure 105. In an embodiment, second portion 145 may be thermally bonded to surface 106 via a heat transfer epoxy or other suitable heat transfer medium, may be clamped to surface 106 using a fastener 146, or may be both bonded and clamped. In an embodiment, thermal conductor 135 is of a plate-like structure with first portion 140 thermally bonded, using a heat transfer epoxy or other suitable heat transfer medium, over the top of the electronic components 130, which are depicted in dotted line fashion in FIG. 2. Alternatively or additionally, first portion 140 may be mounted to circuit board 131 via standoffs 155 and fasteners 160, thereby providing a suitable degree of clamping between first portion 140 and the top surfaces of electronic components 130.

In the exemplary control apparatus 100, heat-generating electronic components 130 are mounted within the housing 125 of PLC 115 in such a manner as to trap most of the heat generated by the components 130. To dissipate this heat, plate (thermal conductor) 135 and particularly the first and second portions 140, 145 of thermal conductor 135 provide a thermal conduction heat transfer path from the surfaces of components 130 to the surface 106 of enclosure 105, thereby enabling heat transfer to the surrounding ambient. Due to the nature of the heat transfer from components 130 to surface 106 via thermal conductor 135, an embodiment of thermal conductor 135 may be referred to as a passive thermal conductor.

In an alternative embodiment, thermal conductor 135 may be a heatpipe, that is, a device containing a fluid that vaporizes at one end, such as the region of first portion 140, as heat is applied, then migrates to the cooler end, such as the region of second portion 145, where it gives up its latent heat of vaporization to a cooler body as it liquefies, and then the liquid migrates back to the hot end, usually by the force of gravity, to begin the process all over again for continuous operation.

Figure 3:
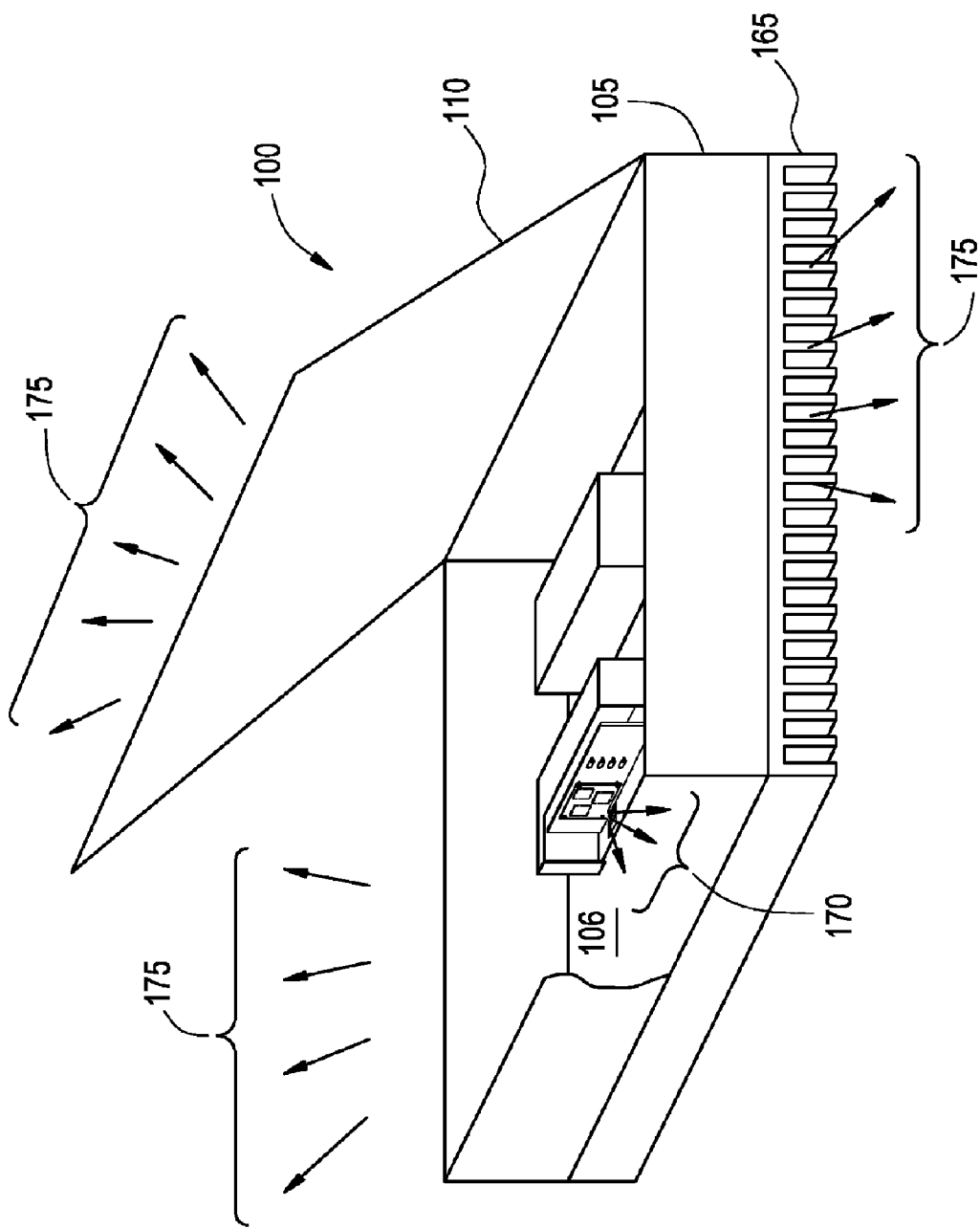
FIG. 3 depicts an isometric partial cutaway view of the exemplary control device of FIG. 2 as part of the exemplary control apparatus of FIG. 1 in accordance with an alternative embodiment of the invention.

Referring now to FIG. 3, an embodiment of control apparatus 100 may also include a heat exchanger 165 that is in thermal communication with the outside of surface 106 of enclosure 105, thereby providing another means of passive heat transfer from component 130 to the ambient surrounding apparatus 100. While FIG. 3 depicts heat exchanger 165 covering the entire back surface of enclosure 105, it will be appreciated that heat exchanger 165 may cover only a portion thereof sufficient for the desired heat transfer effect. In an embodiment, heat exchanger 165 may also be in direct thermal communication with second portion 145 via an opening (not shown) in surface 106. However, in view of the desirability of providing the customer with a modular arrangement of PLCs 115, 120 within enclosure 105, an embodiment of the invention has the second portion 145 in direct thermal communication with surface 106 of enclosure 105, and surface 106 is in direct thermal communication with heat exchanger 165, thereby resulting in second portion 145 being in indirect thermal communication with heat exchanger 165. The outer surfaces defined by enclosure 105 and door 110 define an interior volume of apparatus 100 that is substantially absent fluid communication with the ambient external to enclosure 105 with door 110 closed. Accordingly, and as depicted in FIG. 3, heat transfer from component 130 to the external ambient occurs by way of conduction and convection. The conductive heat transfer, depicted by solids lines having reference numeral 170, takes place between component 130 and surface 106, and the convective heat transfer, depicted by solid lines having reference numeral 175, takes place between any outer surface that is a part of or attached to enclosure 105 and door 106, and the surrounding ambient, thereby allowing components 130 to operate at a lower temperature and stay within their rated operating temperatures for proper operation.

In view of the foregoing description and illustration, it will be appreciated that the thermal conductor 135 performs a method of transferring heat from within a control apparatus 100 to ambient, the control apparatus 100 having an enclosure 105 with a thermally conductive surface 106 and a control device 115 disposed therein, the control device 115 having a housing 125 with a heat-generating electronic component 130 disposed therein and a thermal conductor 135 with a first portion 140 in thermal communication with the heat-generating electronic component 130 and a second portion 145 in direct thermal communication with the thermally conductive surface 106, by: transferring heat from the heat generating electronic component 130 to the first portion 140 of the thermal conductor 135; transferring heat from the first portion 140 of the thermal conductor 135 to the second portion 145 of the thermal conductor 135 along a thermal path that excludes the housing 125 of the control device 115; transferring heat from the second portion 145 of the thermal conductor 135 to the thermally conductive surface 106 of the enclosure 105 of the control apparatus 100; and transferring heat from the thermally conductive surface 106 to ambient.

As disclosed, some embodiments of the invention may include the following advantage: an economical heat transfer arrangement that utilizes an enclosure surface of a control apparatus to dissipate heat generated by an electronic component within a housing of a control device that itself is within the enclosure of the control apparatus.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to a particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A control device configured for mounting within an enclosure, the enclosure having at least one thermally conductive surface, the control device comprising:
   a housing;
   a plurality of heat-generating devices disposed within the housing; and
   a thermal conductor having a first portion in thermal communication with each of the plurality of heat-generating devices and a second portion configured to be in thermal communication with the thermally conductive surface of the enclosure;
   wherein the first portion of the thermal conductor is disposed over the top of and cover each of the plurality of heat-generating devices.

2. The control device of claim 1, wherein:
   the housing comprises an opening; and
   the second portion of the thermal conductor is disposed proximate the opening such that the opening provides for thermal communication between the thermal conductor and the thermally conductive surface of the enclosure.

3. The control device of claim 2, further comprising:
   means for thermally attaching the second portion to the thermally conductive surface of the enclosure.

4. The control device of claim 1, wherein:
   the heat-generating device comprises an electronic component.

5. The control device of claim 1, wherein:
   the thermal conductor is a passive thermal conductor.

6. The control device of claim 1, wherein:
   the heat-generating device comprises a set of electronic components configured to provide programmable logic control.

7. A control apparatus, comprising:
   an enclosure having at least one thermally conductive surface; and
   a control device disposed within the enclosure and in thermal communication with the thermally conductive surface of the enclosure, the control device comprising:
   a housing;
   a plurality of heat-generating devices disposed within the housing; and
   a thermal conductor having a first portion in thermal communication with each of the plurality heat-generating devices and a second portion in thermal communication with the thermally conductive surface of the enclosure;
   wherein the first portion of the thermal conductor is disposed over the top of and covering each of the plurality of heat-generating devices.

8. The control apparatus of claim 7, wherein:
   the housing comprises an opening; and
   the second portion of the thermal conductor is disposed at the opening such that the opening provides for direct thermal communication between the heat-generating device and the thermally conductive surface of the enclosure via the thermal conductor.

9. The control apparatus of claim 7, further comprising:
   a heat transfer medium disposed between the second portion and the thermally conductive surface of the enclosure.

10. The control apparatus of claim 7, wherein:
    the heat-generating device comprises a set of electronic components configured to provide programmable logic control; and
    the thermal conductor is a passive thermal conductor.

11. The control apparatus of claim 7, wherein:
    the thermally conductive surface comprises a metal, a ceramic, a composite, or any combination comprising at least one of the foregoing materials.

12. The control apparatus of claim 7, wherein:
    the control device is one of a plurality of modular control devices.

13. The control apparatus of claim 7, further comprising:
    a fastener disposed at the second portion and configured to provide a compressive load between the second portion and the thermally conductive surface.

14. The control apparatus of claim 7, wherein:
    the enclosure comprises a plurality of surfaces that define an interior volume that may be substantially absent fluid communication with the ambient external to the enclosure, the control device being disposed within the interior volume.

15. The control apparatus of claim 7, further comprising:
    a heat exchanger in thermal communication with the second portion of the thermal conductor, the thermally conductive surface of the enclosure, or both.

16. A method of transferring heat from within a control apparatus to ambient, the control apparatus having an enclosure with a thermally conductive surface and a control device disposed therein, the control device having a housing with a plurality of heat-generating electronic components disposed therein and a thermal conductor with a first portion in thermal communication with each of the plurality of heat-generating electronic components and a second portion in direct thermal communication with the thermally conductive surface, the method comprising:
   transferring heat from the plurality of heat generating electronic components to the first portion of the thermal conductor, the first portion of the thermal conductor being disposed over the top of and covering each of the plurality of heat-generating devices for direct heat transfer therebetween;
   transferring heat from the first portion of the thermal conductor to the second portion of the thermal conductor along a thermal path that excludes the housing of the control device;
   transferring heat from the second portion of the thermal conductor to the thermally conductive surface of the enclosure of the control apparatus; and
   transferring heat from the thermally conductive surface to ambient.

* * * * *